(12) United States Patent
Chang et al.

(10) Patent No.: US 8,723,570 B2
(45) Date of Patent: May 13, 2014

(54) DELAY-LOCKED LOOP AND METHOD FOR A DELAY-LOCKED LOOP GENERATING AN APPLICATION CLOCK

(71) Applicant: Etron Technology, Inc., Hsinchu (TW)

(72) Inventors: Feng-Chia Chang, New Taipei (TW); Yu-Chou Ke, Taichung (TW); Chi-Wei Yen, Hsinchu County (TW); Chun Shiah, Hsinchu (TW)

(73) Assignee: Etron Technology, Inc., Hsinchu (TW)

( * ) Notice: Subject to any disclaimer, the term of this patent is extended or adjusted under 35 U.S.C. 154(b) by 0 days.

(21) Appl. No.: 13/783,409

(22) Filed: Mar. 4, 2013

(65) Prior Publication Data

US 2013/0300474 A1    Nov. 14, 2013

(30) Foreign Application Priority Data

May 14, 2012   (TW) .............................. 101117067 A

(51) Int. Cl.
*H03L 7/06* (2006.01)
(52) U.S. Cl.
USPC .......................................... 327/158; 327/149
(58) Field of Classification Search
CPC ..... H03L 7/0814; H03L 7/0812; G11C 7/222
USPC .................................................. 327/149, 158
See application file for complete search history.

(56) References Cited

U.S. PATENT DOCUMENTS

| | | | | |
|---|---|---|---|---|
| 6,304,116 | B1 * | 10/2001 | Yoon et al. | 327/158 |
| 2004/0000937 | A1 * | 1/2004 | Byun et al. | 327/158 |
| 2008/0252340 | A1 * | 10/2008 | Yeo et al. | 327/156 |
| 2011/0193603 | A1 * | 8/2011 | Ma | 327/158 |
| 2012/0086486 | A1 * | 4/2012 | Na et al. | 327/158 |
| 2012/0230135 | A1 * | 9/2012 | Lin | 365/194 |
| 2012/0274374 | A1 * | 11/2012 | Ma | 327/158 |
| 2013/0127506 | A1 * | 5/2013 | Kwak | 327/158 |

\* cited by examiner

*Primary Examiner* — Adam Houston
(74) *Attorney, Agent, or Firm* — Winston Hsu; Scott Margo

(57) ABSTRACT

A delay-locked loop includes a first delay unit, a second delay unit, a third delay unit, a phase detector, and a controller. The first delay unit generates a first delay clock according to a clock and a first delay time. The second delay unit generates a second delay clock according to the first delay clock and a second delay time. The third delay unit generates a third delay clock according to the second delay clock and a third delay time. The phase detector generates a phase detection signal according to the clock and the second delay clock. The controller generates and outputs a phase control signal according to the phase detection signal. The second delay unit and the third delay unit adjust the second delay time and the third delay time respectively according to the phase control signal.

8 Claims, 8 Drawing Sheets

DELAY-LOCKED LOOP AND METHOD FOR A DELAY-LOCKED LOOP GENERATING AN APPLICATION CLOCK

BACKGROUND OF THE INVENTION

1. Field of the Invention

The present invention relates to a delay-locked loop and a method for a delay-locked loop generating an application clock, and particularly to a delay-locked loop and a method for a delay-locked loop generating an application clock that can be applied to an advanced dynamic random access memory, and not amplify noise within a dynamic random access memory.

2. Description of the Prior Art

Please refer to FIG. 1. FIG. 1 is a diagram illustrating a delay-locked loop 100 according to the prior art. The delay-locked loop 100 includes a first delay unit 102, a replica delay unit 104, a phase detector 106, and a controller 108. As shown in FIG. 1, the first delay unit 102 generates a delay clock DCLK according to an input clock XCLK and a first delay time T1 of the first delay unit 102. The replica delay unit 104 generates a feedback clock FCLK according to the delay clock DCLK and a replica delay time RDT of the replica delay unit 104, where a sum of the first delay time T1 and the replica delay time RDT is equal to a period of the input clock XCLK. The phase detector 106 receives the input clock XCLK and the feedback clock FCLK, and generates a phase detection signal PDS according to a difference between a phase of the input clock XCLK and a phase of the feedback clock FCLK. The controller 108 is coupled to the phase detector 106 for generating a phase control signal PCS to the first delay unit 102 according to the phase detection signal PDS. Thus, the first delay unit 102 can adjust the first delay time T1 according to the phase control signal PCS. That is to say, the first delay unit 102 can adjust a phase of the delay clock DCLK according to the phase control signal PCS. As shown in FIG. 1, the delay clock DCLK is outputted to an internal delay unit 110 of an application circuit, and the internal delay unit 110 can generate an output data clock DQ of the application circuit (e.g. an output data clock of a dynamic random access memory) according to an internal delay time IT of the application circuit and the delay clock DCLK, where the internal delay time IT is the same as the replica delay time RDT.

Please refer to FIG. 2. FIG. 2 is a diagram illustrating relationships of the input clock XCLK, the feedback clock FCLK, and the output data clock DQ. As shown in FIG. 2, because the sum of the first delay time T1 and the replica delay time RDT is equal to the period of the input clock XCLK, when the delay-locked loop 100 is locked, the phase of the feedback clock FCLK and the phase of the input clock XCLK are in phase (or the delay-locked loop 100 locks the difference between the phase of the input clock XCLK and the phase of the feedback clock FCLK at a fixed difference). In addition, because the internal delay time IT is the same as the replica delay time RDT, a sum of the first delay time T1 and the internal delay time IT is also equal to the period of the input clock XCLK. Therefore, a rising edge of the output data clock DQ can be synchronized with a rising edge of the input clock XCLK.

Please refer to FIG. 3. FIG. 3 is a diagram illustrating relationships of the input clock XCLK and the output data clock DQ in an advanced dynamic random access memory process. As shown in FIG. 3, the period of the input clock XCLK is decreased significantly, but the internal delay time IT is not decreased significantly synchronously. Although, a designer can still extend the first delay time T1 to make the rising edge of the feedback clock FCLK be aligned in a rising edge of a next input clock XCLK for a phase of the output data clock DQ and the phase of the input clock XCLK being in phase, a total delay of the delay-locked loop 100 can be longer than the period of the input clock XCLK, resulting in noise within the dynamic random access memory being amplified. Therefore, the delay-locked loop 100 is not proper to the advanced dynamic random access memory process.

SUMMARY OF THE INVENTION

An embodiment provides a delay-locked loop. The delay-locked loop includes a first delay unit, a second delay unit, a third delay unit, a phase detector, and a controller. The first delay unit is used for receiving a clock, and generating a first delay clock according to a first delay time of the first delay unit. The second delay unit is coupled to the first delay unit for receiving the first delay clock, and generating a second delay clock according to a second delay time of the second delay unit. The third delay unit is coupled to the second delay unit for receiving the second delay clock, and generating a third delay clock according to a third delay time of the third delay unit, where the third delay time is the same as the second delay time. The phase detector is used for generating a phase detection signal according to the clock and the second delay clock. The controller is coupled to the phase detector for receiving the phase detection signal, and generating and outputting a phase control signal to the second delay unit and the third delay unit according to the phase detection signal. The second delay unit and the third delay unit adjust the second delay time and the third delay time respectively according to the phase control signal.

Another embodiment provides a method for a delay-locked loop generating an application clock. The method includes receiving a clock and generating a first delay clock according to a first delay time; generating a second delay clock according to the first delay clock and a second delay time; generating a third delay clock according to the second delay clock and a third delay time; generating a phase detection signal according to the clock and the second delay clock; generating and outputting a phase control signal according to the phase detection signal; and adjusting the second delay time and the third delay time according to the phase control signal.

The present invention provides a delay-locked loop and a method for a delay-locked loop generating an application clock. The delay-locked loop and the method first generate a first delay clock through a first delay unit, and then generate a second delay clock through a second delay unit. Therefore, a phase of the second delay clock and a phase of an input clock are still in phase. In addition, because a fourth delay time is the same as a first delay time and a third delay time is the same as a second delay time, a sum of the fourth delay time and the third delay time is equal to a period of the input clock. Therefore, a rising edge of an output data clock of an application circuit can be synchronized with a rising edge of the input clock. In addition, the present invention can further utilize an interpolation to obtain an interpolation clock with a finer phase and output the interpolation clock to a third delay unit to increase resolution of the delay-locked loop after the delay-locked loop locks the phase of the input clock. Compared to the prior art, in an advanced dynamic random access memory process, because the present invention can still ensure that the rising edge of the output data clock of the application circuit synchronizes with the rising edge of the input clock, and the present invention can move an internal delay unit outside the delay-locked loop, a total delay of the delay-locked loop is smaller or equal to the period of the input clock, resulting in the present invention not amplifying noise within a dynamic random access memory.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
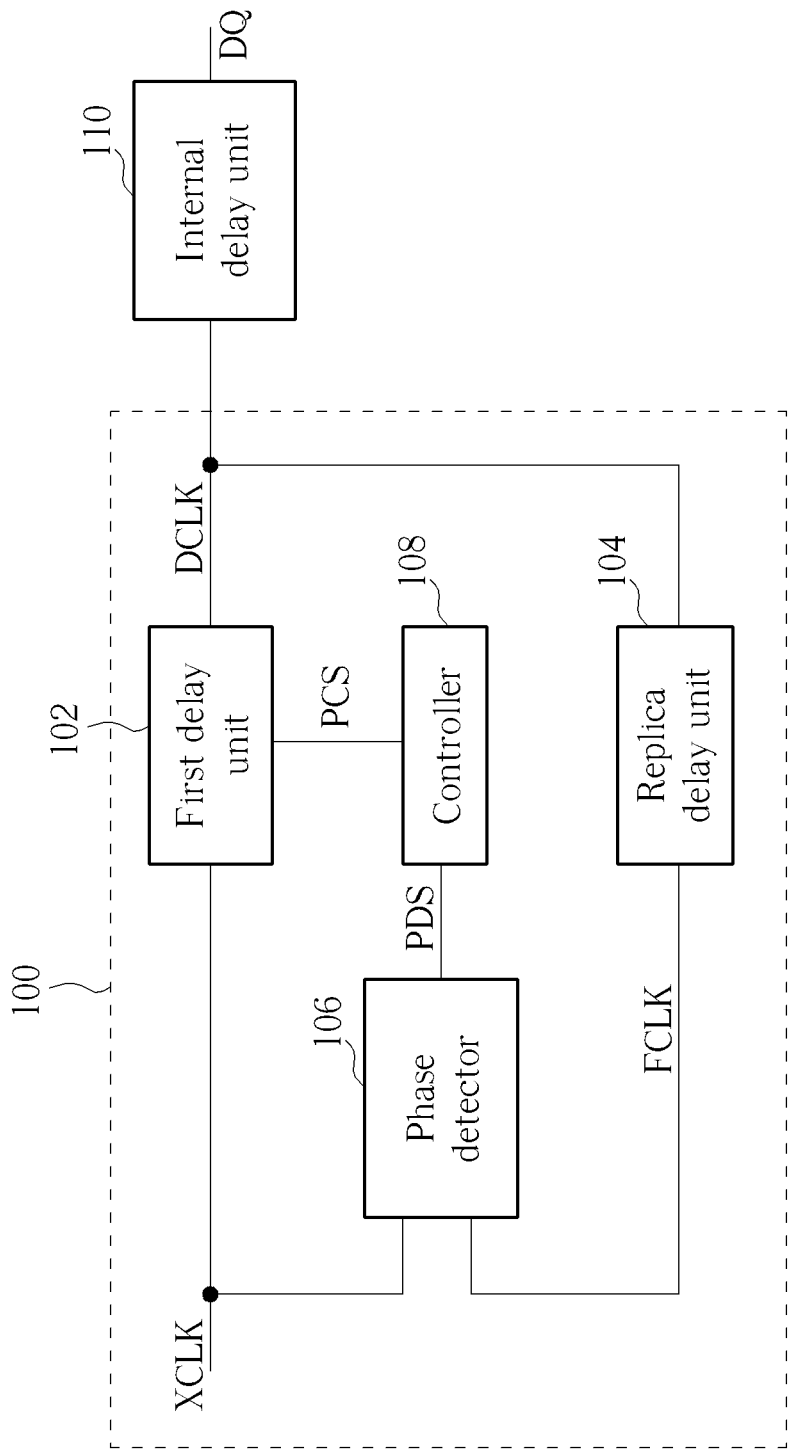
FIG. 1 is a diagram illustrating a delay-locked loop according to the prior art.
Figure 2:
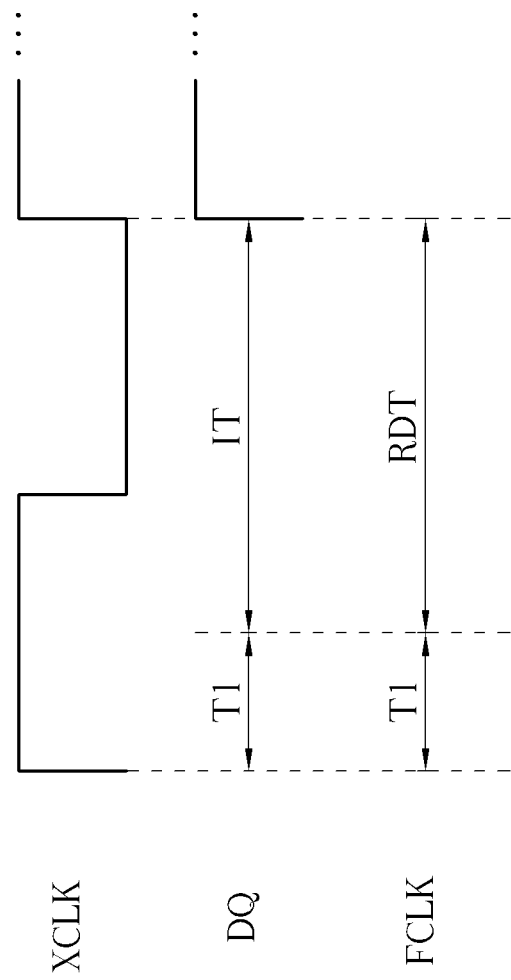
FIG. 2 is a diagram illustrating relationships of the input clock, the feedback clock, and the output data clock.
Figure 3:
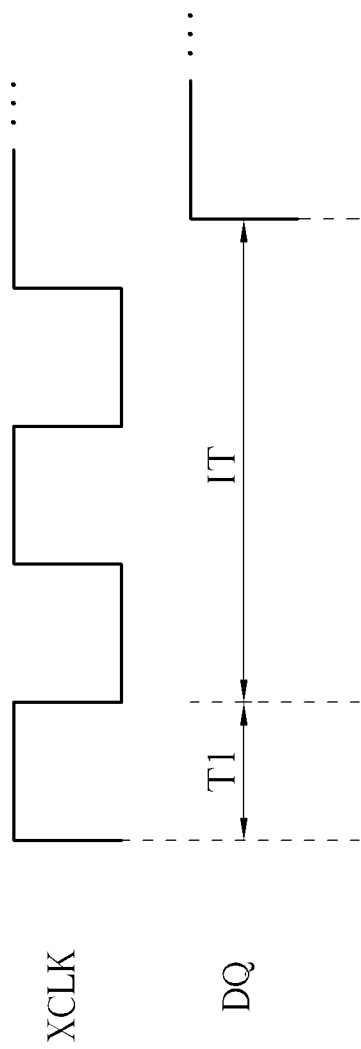
FIG. 3 is a diagram illustrating relationships of the input clock and the output data clock in an advanced dynamic random access memory process.
Figure 4:
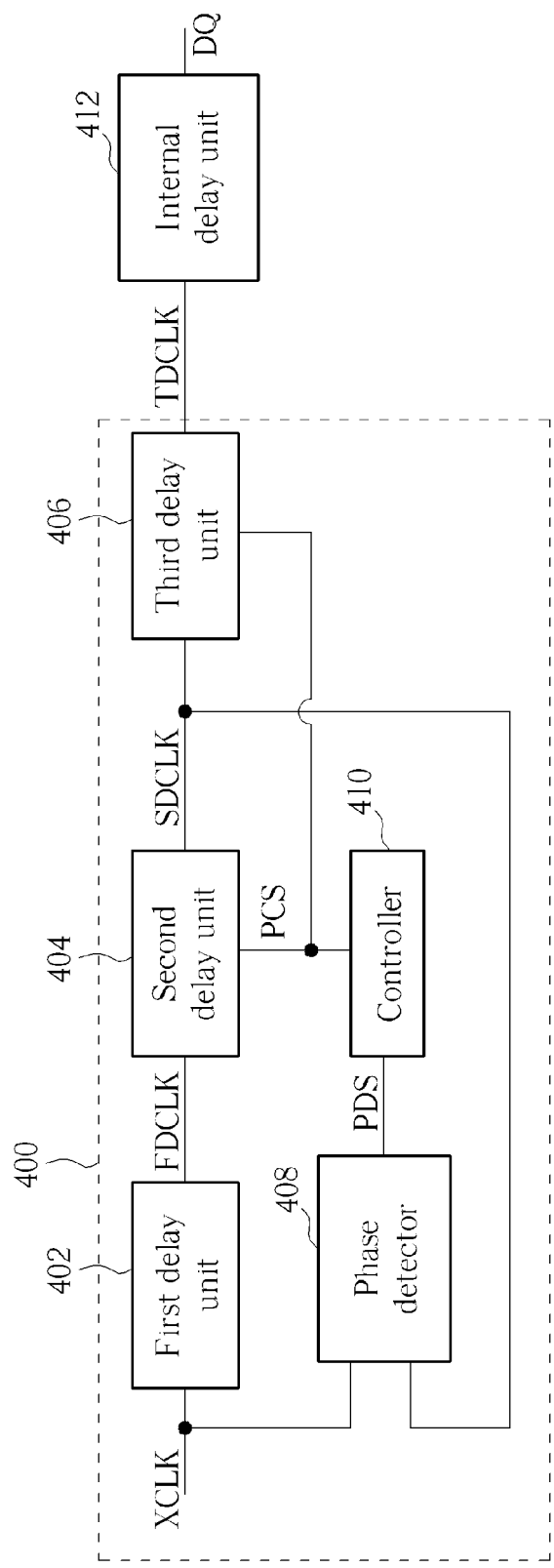
FIG. 4 is a diagram illustrating a delay-locked loop according to an embodiment.

Please refer to FIG. 4. FIG. 4 is a diagram illustrating a delay-locked loop 400 according to an embodiment. The delay-locked loop 400 includes a first delay unit 402, a second delay unit 404, a third delay unit 406, a phase detector 408, and a controller 410. The first delay unit 402 is used for receiving an input clock XCLK, and generating a first delay clock FDCLK according to a first delay time T1 of the first delay unit 402. The second delay unit 404 is coupled to the first delay unit 402 for receiving the first delay clock FDCLK, and generating a second delay clock SDCLK according to a second delay time T2 of the second delay unit 404. The third delay unit 406 is coupled to the second delay unit 404 for receiving the second delay clock SDCLK, and generating a third delay clock TDCLK according to a third delay time T3 of the third delay unit 406, where the third delay time T3 is the same as the second delay time T2, and a sum of the first delay time T1 and the second delay time T2 is equal to a period of the input clock XCLK. The phase detector 408 is used for receiving the input clock XCLK and the second delay clock SDCLK, and generating a phase detection signal PDS according to a difference between a phase of the input clock XCLK and a phase of the second delay clock SDCLK. The controller 410 is coupled to the phase detector 408 for receiving the phase detection signal PDS, and generating and outputting a phase control signal PCS to the second delay unit 404 and the third delay unit 406 according to the phase detection signal PDS. The second delay unit 404 and the third delay unit 406 can adjust the second delay time T2 and the third delay time T3 respectively according to the phase control signal PCS.

As shown in FIG. 4, when the phase of the input clock XCLK leads the phase of the second delay clock SDCLK, the phase detector 408 generates the phase detection signal PDS according to the difference (corresponding to the phase of the input clock XCLK leading the phase of the second delay clock SDCLK) between the phase of the input clock XCLK and the phase of the second delay clock SDCLK. Then, the controller 410 can generate and output the phase control signal PCS (corresponding to the phase of the input clock XCLK leading the phase of the second delay clock SDCLK) to the second delay unit 404 and the third delay unit 406 according to the phase detection signal PDS (corresponding to the phase of the input clock XCLK leading the phase of the second delay clock SDCLK). Therefore, the second delay unit 404 and the third delay unit 406 can reduce the second delay time T2 and the third delay time T3 respectively according to the phase control signal PCS (corresponding to the phase of the input clock XCLK leading the phase of the second delay clock SDCLK). Similarly, when the phase of the input clock XCLK lags the phase of the second delay clock SDCLK, the phase detector 408 generates the phase detection signal PDS according to the difference (corresponding to the phase of the input clock XCLK lagging the phase of the second delay clock SDCLK) between the phase of the input clock XCLK and the phase of the second delay clock SDCLK. Then, the controller 410 can generate and output the phase control signal PCS (corresponding to the phase of the input clock XCLK lagging the phase of the second delay clock SDCLK) to the second delay unit 404 and the third delay unit 406 according to the phase detection signal PDS (corresponding to the phase of the input clock XCLK lagging the phase of the second delay clock SDCLK). Therefore, the second delay unit 404 and the third delay unit 406 can increase the second delay time T2 and the third delay time T3 respectively according to the phase control signal PCS (corresponding to the phase of the input clock XCLK lagging the phase of the second delay clock SDCLK).

Figure 5:
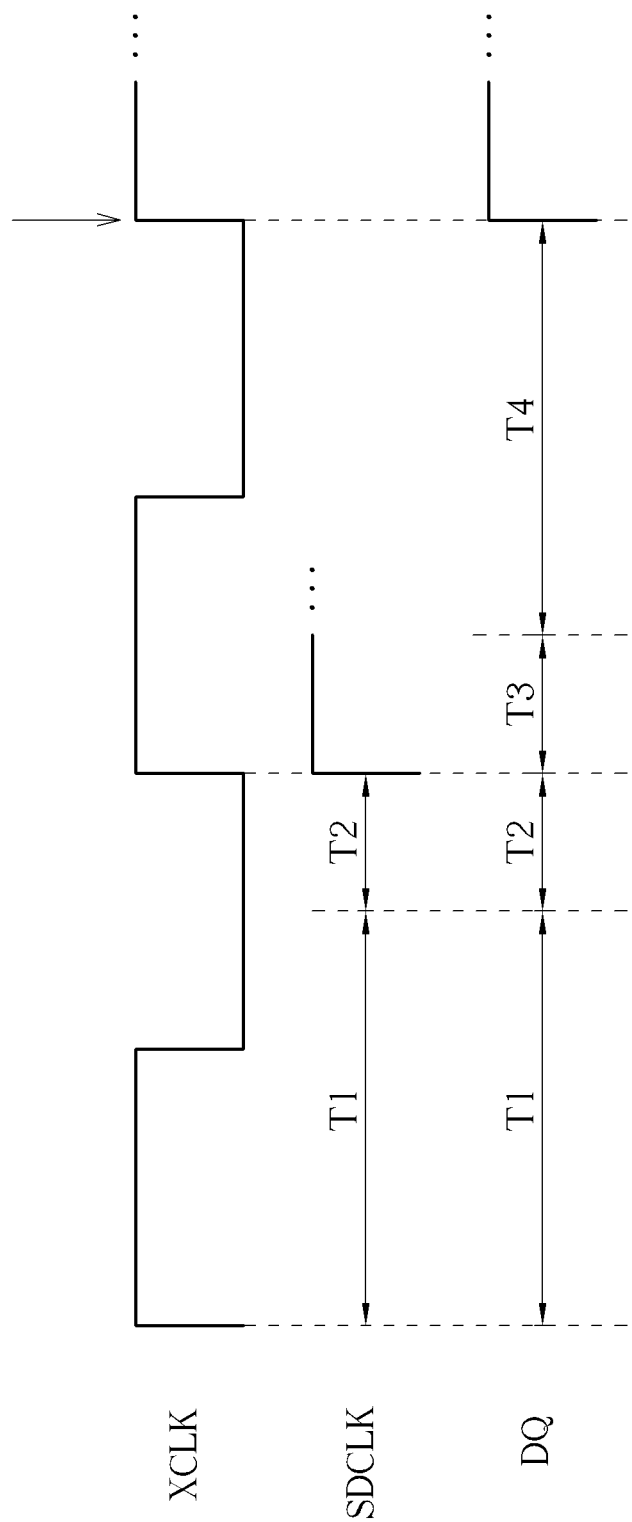
FIG. 5 is a diagram illustrating relationships of the input clock, the second delay clock, and the output data clock.

As shown in FIG. 4, an internal delay unit 412 of an application circuit is coupled to the third delay unit 406 for receiving the third delay clock TDCLK, and generating an output data clock DQ of the application circuit (e.g. an output data clock of a dynamic random access memory) according to a fourth delay time T4 of the internal delay unit 412, where the fourth delay time T4 is the same as the first delay time T1. But, the present invention is not limited to the output data clock DQ being the output data clock of the dynamic random access memory. Please refer to FIG. 5. FIG. 5 is a diagram illustrating relationships of the input clock XCLK, the second delay clock SDCLK, and the output data clock DQ. As shown in FIG. 5, because the sum of the first delay time T1 and the second delay time T2 is equal to the period of the input clock XCLK, when the delay-locked loop 400 is locked, the phase of the second delay clock SDCLK and the phase of the input clock XCLK are in phase. In addition, because the second delay time T2 is the same as the third delay time T3 and the fourth delay time T4 is the same as the first delay time T1, a sum of the fourth delay time T4 and the third delay time T3 is also equal to the period of the input clock XCLK. Therefore, a rising edge of the output data clock DQ can be synchronized with a rising edge of the input clock XCLK (an arrow as shown in FIG. 5). In addition, in another embodiment of the present invention, the delay-locked loop 400 further includes the internal delay unit 412.

Figure 6:
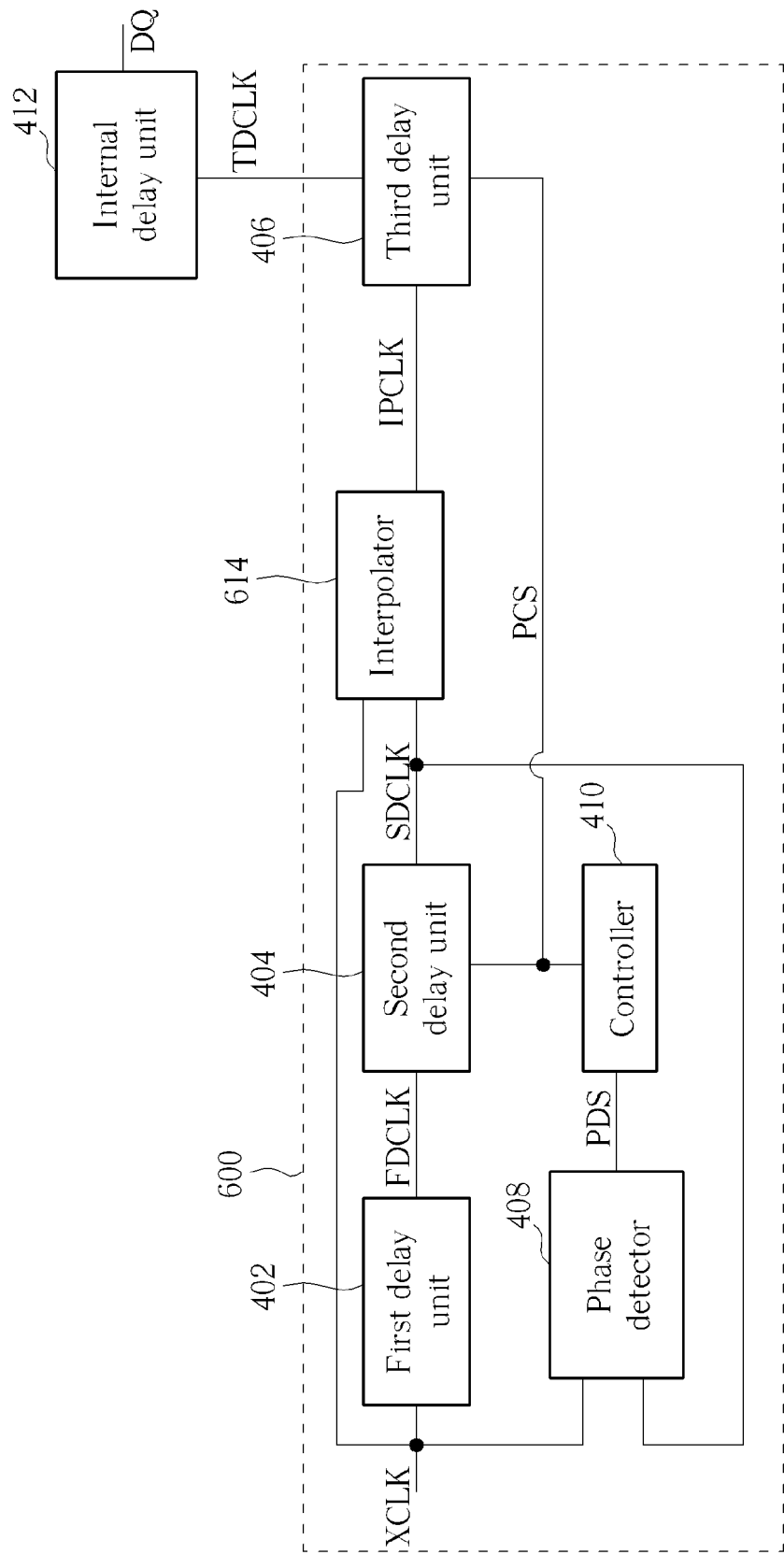
FIG. 6 is a diagram illustrating a delay-locked loop according to another embodiment.

Please refer to FIG. 6. FIG. 6 is a diagram illustrating a delay-locked loop 600 according to another embodiment. A difference between the delay-locked loop 600 and the delay-locked loop 400 is that the delay-locked loop 600 further includes an interpolator 614. The interpolator 614 is coupled between the second delay unit 404 and the third delay unit 406, where the interpolator 614 is used for generating an interpolation clock IPCLK according to the second delay clock SDCLK and the input clock XCLK, and the third delay unit 406 generates the third delay clock TDCLK according to the third delay time T3 and the interpolation clock IPCLK. Therefore, the interpolator 614 can utilize an interpolation to obtain a finer fixed difference between the phase of the input clock XCLK and a phase of the interpolation clock IPCLK to increase resolution of the delay-locked loop 600 after the delay-locked loop 600 locks a difference between the phase of the input clock XCLK and the phase of the second delay clock SDCLK. That is to say, when the delay-locked loop 600 locks the difference between the phase of the input clock XCLK and the phase of the second delay clock SDCLK, the interpolator 614 can reduce the fixed difference between the phase of the input clock XCLK and the phase of the interpolation clock IPCLK. In addition, in another embodiment of the present invention, the delay-locked loop 600 also further includes the internal delay unit 412. In addition, subsequent operational principles of the delay-locked loop 600 are the same as those of the delay-locked loop 400, so further description thereof is omitted for simplicity.

Figure 7:
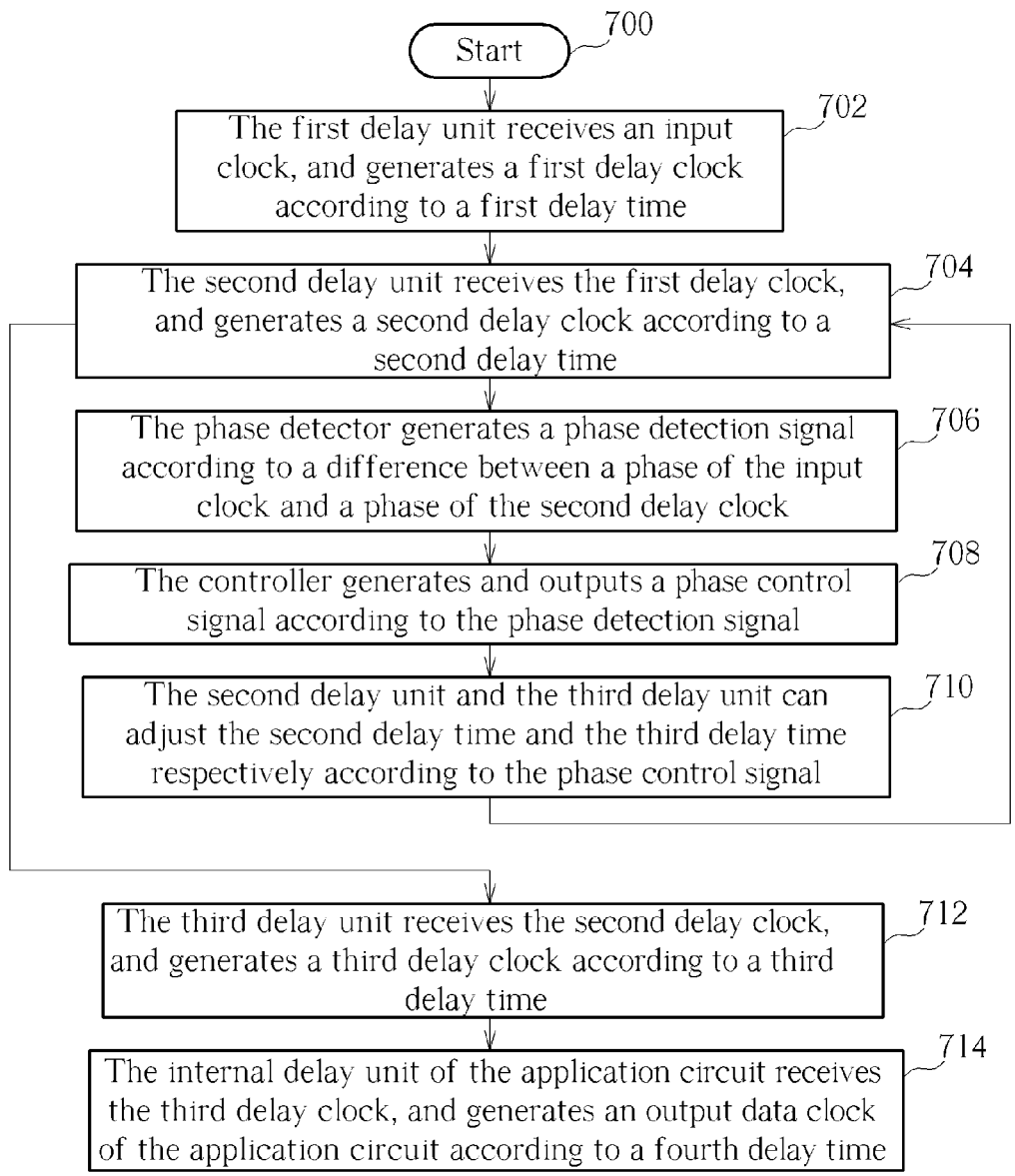
FIG. 7 is a flowchart illustrating a method for a delay-locked loop generating an application clock according to another embodiment.

Please refer to FIG. 4, FIG. 5, and FIG. 7. FIG. 7 is a flowchart illustrating a method for a delay-locked loop generating an application clock according to another embodiment. The method in FIG. 7 is illustrated using the delay-locked loop 400 in FIG. 4. Detailed steps are as follows:

Step 700: Start.

Step 702: The first delay unit 402 receives an input clock XCLK, and generates a first delay clock FDCLK according to a first delay time T1.

Step 704: The second delay unit 404 receives the first delay clock FDCLK, and generates a second delay clock SDCLK according to a second delay time T2; go to Step 706 and Step 712.

Step 706: The phase detector 408 generates a phase detection signal PDS according to a difference between a phase of the input clock XCLK and a phase of the second delay clock SDCLK.

Step 708: The controller 410 generates and outputs a phase control signal PCS according to the phase detection signal PDS.

Step 710: The second delay unit 404 and the third delay unit 406 can adjust the second delay time T2 and the third delay time T3 respectively according to the phase control signal PCS; go to Step 704.

Step 712: The third delay unit 406 receives the second delay clock SDCLK, and generates a third delay clock TDCLK according to a third delay time T3.

Step 714: The internal delay unit 412 of the application circuit receives the third delay clock TDCLK, and generates an output data clock DQ of the application circuit according to a fourth delay time T4.

In Step 702 and Step 704, as shown in FIG. 5, because a sum of the first delay time T1 and the second delay time T2 is equal to a period of the input clock XCLK, when the delay-locked loop 400 locks a difference between a phase of the input clock XCLK and a phase of the second delay clock SDCLK, the phase of the second delay clock SDCLK and the phase of the input clock XCLK are in phase. In Step 706, the phase detector 408 can generate the phase detection signal PDS according to the phase of the input clock XCLK leading or lagging the phase of the second delay clock SDCLK (that is, the difference between the phase of the input clock XCLK and the phase of the second delay clock SDCLK). In Step 708, the controller 410 can generate and output the phase control signal PCS according to the phase detection signal PDS. In Step 710, the second delay unit 404 and the third delay unit 406 can adjust the second delay time T2 and third delay time T3 respectively according to the phase control signal PCS.

That is to say, when the phase of the input clock XCLK leads the phase of the second delay clock SDCLK, the second delay unit 404 and the third delay unit 406 can reduce the second delay time T2 and the third delay time T3 respectively according to the phase control signal PCS; when the phase of the input clock XCLK lags the phase of the second delay clock SDCLK, the second delay unit 404 and the third delay unit 406 can increase the second delay time T2 and the third delay time T3 respectively according to the according to phase control signal PCS. In Step 712 and Step 714, because the fourth delay time T4 is the same as the first delay time T1 and the third delay time T3 is the same as the second delay time T2, as shown in FIG. 5, a sum of the fourth delay time T4 and the third delay time T3 is also equal to the period of the input clock XCLK. Therefore, a rising edge of the output data clock DQ can be synchronized with a rising edge of the input clock XCLK (the arrow as shown in FIG. 5).

Figure 8:
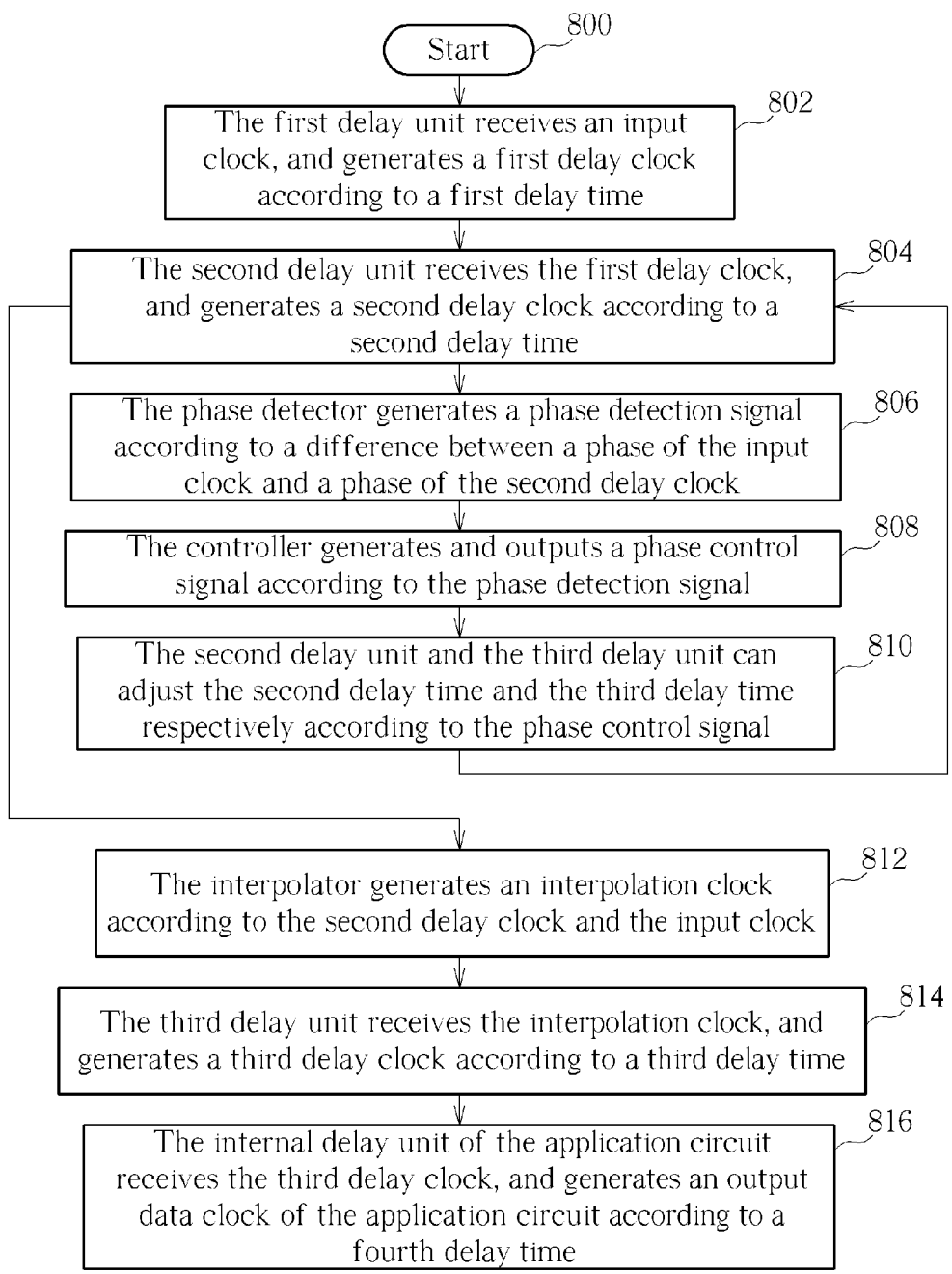
FIG. 8 is a flowchart illustrating a method for a delay-locked loop generating an application clock according to another embodiment.

Please refer to FIG. 6 and FIG. 8. FIG. 8 is a flowchart illustrating a method for a delay-locked loop generating an application clock according to another embodiment. The method in FIG. 8 is illustrated using the delay-locked loop 600 in FIG. 6. Detailed steps are as follows:

Step 800: Start.

Step 802: The first delay unit 402 receives an input clock XCLK, and generates a first delay clock FDCLK according to a first delay time T1.

Step 804: The second delay unit 404 receives the first delay clock FDCLK, and generates a second delay clock SDCLK according to a second delay time T2; go to Step 806 and Step 812.

Step 806: The phase detector 408 generates a phase detection signal PDS according to a difference between a phase of the input clock XCLK and a phase of the second delay clock SDCLK.

Step 808: The controller 410 generates and outputs a phase control signal PCS according to the phase detection signal PDS.

Step 810: The second delay unit 404 and the third delay unit 406 can adjust the second delay time T2 and the third delay time T3 respectively according to the phase control signal PCS; go to Step 804.

Step 812: The interpolator 614 generates an interpolation clock IPCLK according to the second delay clock SDCLK and the input clock XCLK.

Step 814: The third delay unit 406 receives the interpolation clock IPCLK, and generates a third delay clock TDCLK according to a third delay time T3.

Step 816: The internal delay unit 412 of the application circuit receives the third delay clock TDCLK, and generates an output data clock DQ of the application circuit according to a fourth delay time T4.

A difference between the embodiment in FIG. 8 and the embodiment in FIG. 7 is that in Step 812, the interpolator 614 generates the interpolation clock IPCLK according to the second delay clock SDCLK and the input clock XCLK. Therefore, the interpolator 614 can utilize an interpolation to obtain a finer fixed difference between a phase of the input clock XCLK and a phase of the interpolation clock IPCLK to increase resolution of the delay-locked loop 600 after the delay-locked loop 600 locks a difference between a phase of the input clock XCLK and a phase of the second delay clock SDCLK. That is to say, when the delay-locked loop 600 locks the difference between the phase of the input clock XCLK and the phase of the second delay clock SDCLK, the interpolator 614 can reduce the fixed difference between the phase of the input clock XCLK and the phase of the interpolation clock IPCLK. In addition, as shown in FIG. 6, because the third delay unit 406 is coupled to the interpolator 614, in Step 814, the third delay unit 406 generates the third delay clock TDCLK according to the interpolation clock IPCLK and the third delay time T3. In addition, subsequent operational principles of the embodiment in FIG. 8 are the same as those of the embodiment in FIG. 7, so further description thereof is omitted for simplicity.

To sum up, the delay-locked loop and the method for the delay-locked loop generating the application clock first generate the first delay clock through the first delay unit, and then generate the second delay clock through the second delay unit. Therefore, the phase of the second delay clock and the phase of the input clock are still in phase. In addition, because the fourth delay time is the same as the first delay time and the third delay time is the same as the second delay time, the sum of the fourth delay time and the third delay time is equal to the period of the input clock. Therefore, the rising edge of the output data clock can be synchronized with the rising edge of the input clock. In addition, the present invention can further utilize an interpolation to obtain the finer fixed difference between the phase of the input clock and the phase of the interpolation clock to increase the resolution of the delay-locked loop after the delay-locked loop locks the difference between the phase of the input clock and the phase of the second delay clock. Compared to the prior art, in an advanced dynamic random access memory process, because the present invention can still ensure that the rising edge of the output data clock of the application circuit is synchronized with the rising edge of the input clock, and the present invention can move the internal delay unit outside the delay-locked loop, a total delay of the delay-locked loop is smaller or equal to the period of the input clock, resulting in the present invention not amplifying noise within the dynamic random access memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay-locked loop, comprising:
    a first delay unit for receiving a clock, and generating a first delay clock according to a first delay time of the first delay unit and the clock;
    a second delay unit coupled to the first delay unit for receiving the first delay clock, and generating a second delay clock according to a second delay time of the second delay unit and the first delay clock;
    a third delay unit coupled to the second delay unit for receiving the second delay clock, and generating a third delay clock according to a third delay time of the third delay unit and the second delay clock, wherein the third delay time is equal to the second delay time, a sum of the first delay time and the second delay time is equal to a period of the clock;
    an internal delay unit of an application circuit coupled to the third delay unit for receiving the third delay clock, and generating an output data clock of the application circuit according to a fourth delay time and the third delay clock, wherein the first delay time is equal to the fourth delay time;
    a phase detector for generating a phase detection signal only according to the clock and the second delay clock; and
    a controller coupled to the phase detector for receiving the phase detection signal, and generating and outputting a phase control signal to the second delay unit and the third delay unit according to the phase detection signal, wherein the phase control signal is not transmitted to the first delay unit;
    wherein the second delay unit and the third delay unit adjust the second delay time and the third delay time respectively according to the phase control signal.

2. The delay-locked loop of claim 1, wherein the phase detector generates the phase detection signal according to a difference between a phase of the clock and a phase of the second delay clock.

3. The delay-locked loop of claim 1, further comprising:
    an interpolator coupled between the second delay unit and the third delay unit, wherein the interpolator generates an interpolation clock according to the second delay clock and the clock, and the third delay unit generates the third delay clock according to the third delay time and the interpolation clock.

4. A method for a delay-locked loop generating an application clock, the method comprising:
    receiving a clock and generating a first delay clock according to a first delay time and the clock;
    generating a second delay clock according to the first delay clock and a second delay time;
    generating a third delay clock according to the second delay clock and a third delay time, wherein the third delay time is equal to the second delay time, a sum of the first delay time and the second delay time is equal to a period of the clock, and the first delay time is equal to a fourth delay time of an internal delay unit of an application circuit;
    generating a phase detection signal only according to the clock and the second delay clock;
    generating and outputting a phase control signal according to the phase detection signal; and
    adjusting the second delay time and the third delay time according to the phase control signal, wherein the first delay time is not adjusted according to the phase control signal.

5. The method of claim 4, wherein generating the phase detection signal according to the clock and the second delay clock is generating the phase detection signal according to a difference between a phase of the clock and a phase of the second delay clock.

6. The method of claim 4, further comprising:
    generating an output data clock of the application circuit according to the third delay clock and the fourth delay time.

7. The method of claim 4, further comprising:
    generating an interpolation clock according to the second delay clock and the clock; and
    generating the third delay clock according to the third delay time and the interpolation clock.

8. The method of claim 7, further comprising:
    generating an output data clock of the application circuit according to the third delay clock and the fourth delay time.

* * * * *